United States Patent
Huang et al.

(10) Patent No.: US 7,700,479 B2
(45) Date of Patent: Apr. 20, 2010

(54) CLEANING PROCESSES IN THE FORMATION OF INTEGRATED CIRCUIT INTERCONNECT STRUCTURES

(75) Inventors: Cheng-Lin Huang, Hsinchu (TW); Ching-Hua Hsieh, Hsinchu (TW); Shau-Lin Shue, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 121 days.

(21) Appl. No.: 11/593,286

(22) Filed: Nov. 6, 2006

(65) Prior Publication Data

US 2008/0124919 A1    May 29, 2008

(51) Int. Cl.
    *H01L 21/4763* (2006.01)
(52) U.S. Cl. ............. 438/643; 438/780; 257/E21.584
(58) Field of Classification Search ............. 438/643, 438/780, 725
    See application file for complete search history.

(56) References Cited

U.S. PATENT DOCUMENTS

| | | | | |
|---|---|---|---|---|
| 6,620,727 B2 * | 9/2003 | Brennan | ........... | 438/637 |
| 6,723,599 B2 * | 4/2004 | Eppich et al. | ........... | 438/240 |
| 2002/0162736 A1 * | 11/2002 | Ngo et al. | ........... | 204/192.12 |
| 2005/0257890 A1 * | 11/2005 | Park et al. | ........... | 156/345.35 |
| 2007/0007654 A1 * | 1/2007 | Man | ........... | 257/751 |

* cited by examiner

*Primary Examiner*—Phat X Cao
*Assistant Examiner*—Nga Doan
(74) *Attorney, Agent, or Firm*—Slater & Matsil, L.L.P.

(57) ABSTRACT

A method for fabricating an integrated circuit includes providing a substrate, forming a low-k dielectric layer over the substrate, etching the low-k dielectric layer to form an opening in the low-k dielectric layer wherein an underlying metal is exposed through the opening, performing a remote plasma treatment to the substrate wherein a plasma used for the remote plasma treatment is generated from a plasma generator separated from a chamber in which the substrate is located, forming a diffusion barrier layer in the opening, and filling the opening with a conductive material. The method preferably includes an in-situ plasma treatment in a same chamber as the step of etching the low-k dielectric layer.

12 Claims, 5 Drawing Sheets

CLEANING PROCESSES IN THE FORMATION OF INTEGRATED CIRCUIT INTERCONNECT STRUCTURES

TECHNICAL FIELD

This invention is related generally to integrated circuits, and more particularly to the fabrication processes of interconnect structures in integrated circuits.

BACKGROUND

Conductive lines or interconnect structures are used to connect devices in integrated circuits and to connect to external pads. A significant problem in the formation of interconnect structures is the parasitic capacitances between metal lines. Parasitic capacitances cause an increase in RC delay. In some high-speed circuits, interconnect capacitances can be the limiting factor in the speed of the integrated circuit. Thus it is desirable to reduce the interconnect capacitances. Accordingly, low dielectric constant (low-k) materials have been increasingly used. However, it has been found that low-k materials are often subject to damage during the formation of interconnect structures.

FIGS. 1 and 2 illustrate cross-sectional views in the manufacture of a typical interconnect structure. Referring to FIG. 1, an etch stop layer 12 and a low-k dielectric layer 2 are formed on a metal line 14. A photo resist 6 is formed over low-k dielectric layer 2. Photo resist 6 is then patterned as a mask. An opening 8 is formed in low-k dielectric layer 2, preferably by dry etching. Referring to FIG. 2, photo resist 6 is removed, preferably by an ashing process. Exposed etch stop layer 12 is then removed to expose underlying metal line 14. Typically, low-k dielectric layer 2 contains carbon, and the steps of etching low-k dielectric layer 2, ashing photo resist 6, and removing etch stop layer 12 generate polymers, such as $CF_x$, as by-products. A layer of polymers is schematically illustrated as a layer 10 in FIG. 2, which covers the bottom and sidewalls of opening 8. The polymers adversely affect the characteristics and reliability of the resulting interconnect structure, thus need to be removed.

Conventionally, polymer layer 10 is removed by a wet clean process. The conventional wet clean process, however, suffers drawbacks. Referring to FIG. 3, the width of trench opening 8 is increased from a width W1 before the ashing step to a width W2 before trench opening 8 is filled. For narrow trenches having widths close to the critical dimension, the respective width change may be significant enough to affect the subsequent process steps and the characteristics of the interconnect structures.

Before the formation of a diffusion barrier layer (not shown) and the filling of trench opening 8, a pre-metal clean, which typically includes an in-situ plasma etching, is performed to remove undesired contaminations such as copper oxide. The conventional pre-metal clean process causes k value increases, micro-structure distortion and pore size enlargement, partially due to the high concentration of charges in the plasma.

Accordingly, the cleaning processes used for forming interconnect structures need to be improved.

SUMMARY OF THE INVENTION

In accordance with one aspect of the present invention, a method for fabricating an integrated circuit includes providing a substrate, forming a low-k dielectric layer over the substrate, etching the low-k dielectric layer to form an opening in the low-k dielectric layer wherein an underlying metal is exposed through the opening, performing a remote plasma treatment to the substrate wherein a plasma used for the remote plasma treatment is generated from a plasma generator separated from a chamber in which the substrate is located, forming a diffusion barrier layer in the opening, and filling the opening with a conductive material.

In accordance with another aspect of the present invention, a method for fabricating an integrated circuit includes providing a substrate, forming a low-k dielectric layer over the substrate, dry etching the low-k dielectric layer in a chamber to form an opening in the low-k dielectric layer, performing an in-situ plasma treatment in the same chamber to clean polymers, forming a diffusion barrier layer in the opening, and filling the opening with a conductive material.

In accordance with yet another aspect of the present invention, a method for fabricating an integrated circuit includes providing a substrate, forming a low-k dielectric layer over the substrate, dry etching the low-k dielectric layer to form an opening in a first chamber, wherein a polymer is generated as a by-product, performing an in-situ plasma treatment in the first chamber to remove the polymer, performing a remote plasma treatment in a second chamber different from the first chamber wherein a plasma is generated from a plasma generator separated from the second chamber and wherein the step of the in-situ plasma treatment and the step of the remote plasma treatment use a process gas selected from the group consisting essentially of $H_2$, CO, $CO_2$, $O_2$, $H_2O$, $N_2O$, $NH_3$, $CH_4$, $CO/CO_2$, $N_2/H_2$, $N_2/O_2$, $NF_3$, $CF_4$, and combinations thereof, a carrier gas selected from the group consisting essentially of He, Ne, Ar, Kr, Xe, Rn and combinations thereof, forming a diffusion barrier layer in the opening, forming a seed layer on the diffusion barrier layer, and filling the opening with a conductive material.

The advantageous features of the present invention include small shifts in the low-k dielectric properties and decreased trench enlargement.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming an interconnect structure is provided. The intermediate stages for manufacturing the preferred embodiment of the present invention are illustrated. Throughout the various views and illustrative embodiments of the present invention, like reference numbers are used to designate like elements.

Figure 1:
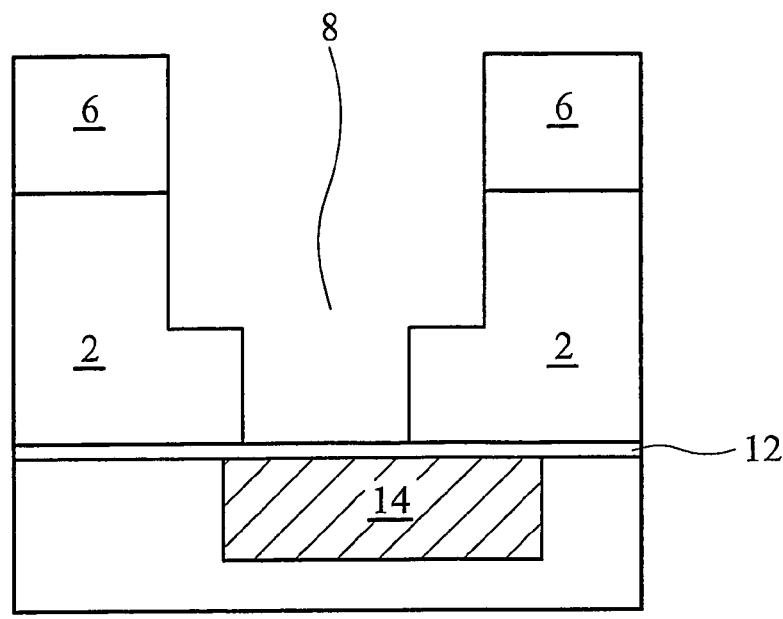
FIGS. 1 through 3 illustrate a conventional interconnect formation process.
Figure 2:
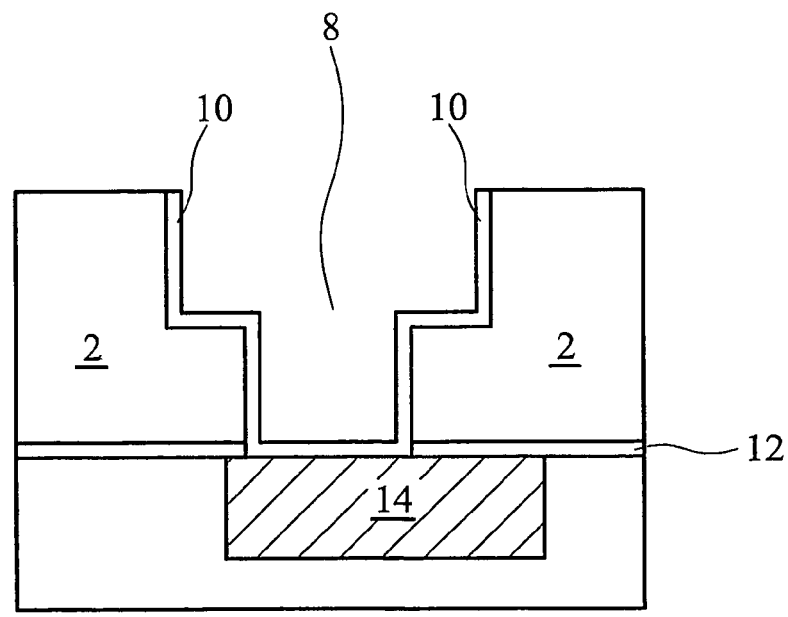
Figure 3:
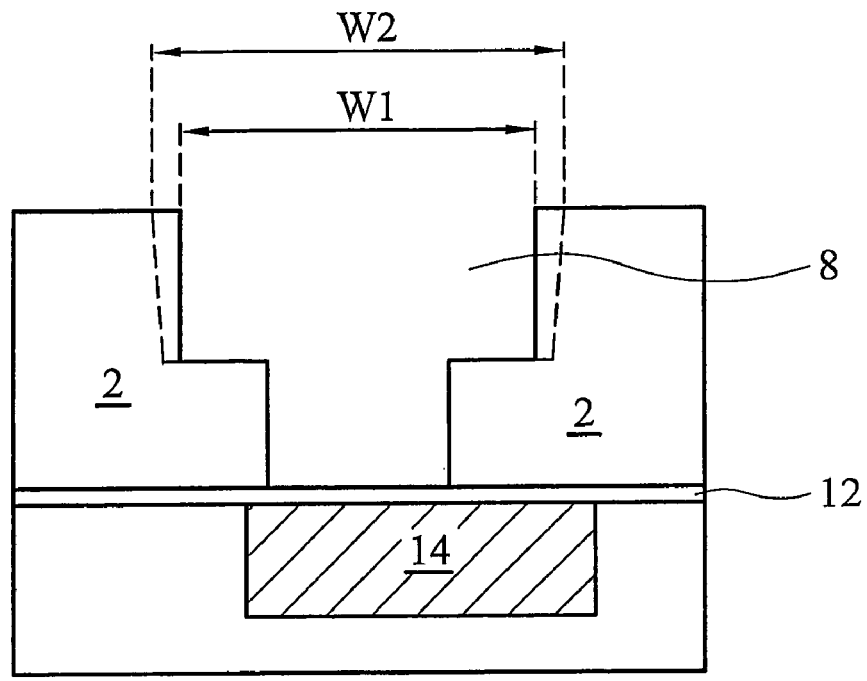
Figure 4:
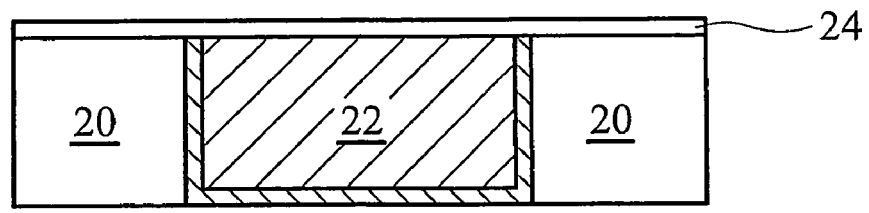
FIGS. 4 through 6 are cross-sectional views of intermediate stages in the manufacture of a preferred interconnect structure.

FIG. 4 illustrates a starting structure having a conductive line 22 formed in a dielectric layer 20. Conductive line 22 and dielectric layer 20 are over a semiconductor substrate (not shown), which is preferably a silicon substrate having semiconductor devices formed thereon. Conductive line 22 is preferably a metal line comprising copper, tungsten, aluminum, silver, gold, alloys thereof, compounds thereof, and combinations thereof. Conductive line 22 is typically connected to another underlying feature (not shown), such as a via or a contact plug. Dielectric layer 20 may be an inter-layer dielectric (ILD) layer or an inter-metal dielectric (IMD) layer, and preferably has a low k value.

A dielectric layer 24, preferably an etch stop layer (ESL), is formed on dielectric layer 20 and conductive line 22. Preferably, ESL 24 comprises nitrides, silicon-carbon based materials, carbon-doped oxides, and combinations thereof. The preferred formation method is plasma enhanced chemical vapor deposition (PECVD). However, other commonly used methods such as high-density plasma CVD (HDPCVD), atomic layer CVD (ALCVD), and the like can also be used. In an exemplary embodiment wherein ESL 24 comprises silicon nitride or silicon carbide, the formation is preferably performed in a chamber in which gaseous precursors such as silane ($SiH_4$) and ammonia ($NH_3$) are introduced for a chemical reaction.

In alternative embodiments, dielectric layer 24 is a diffusion barrier layer preventing undesirable elements, such as copper, from diffusing into the subsequently formed low-k dielectric layer. In a more preferred embodiment, dielectric layer 24 acts as both an etch stop layer and a diffusion barrier layer.

Figure 5:
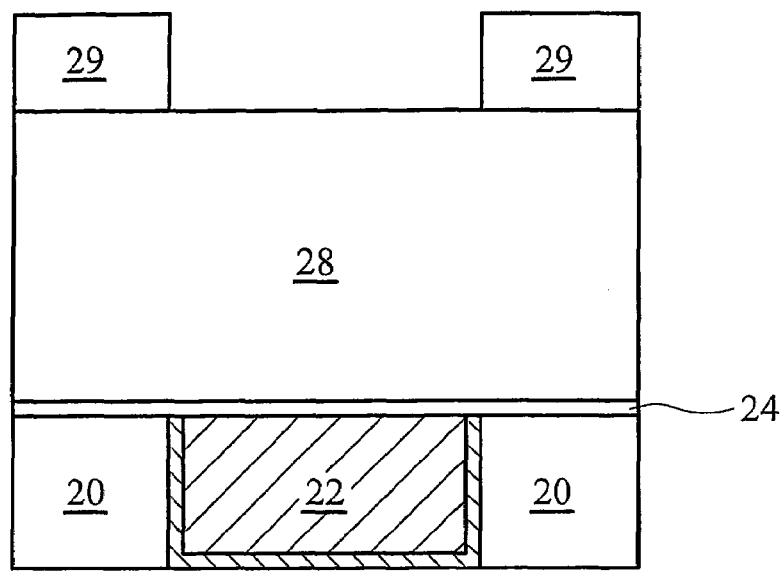

FIG. 5 illustrates the formation of a low-k dielectric layer 28, which provides insulation between the metallization layers. Accordingly, low-k dielectric layer 28 is sometimes referred to as an inter-metal dielectric (IMD) layer. Low-k dielectric layer 28 preferably has a dielectric constant (k) value of lower than about 3.5, and more preferably lower than about 2.5. The preferred materials include carbon-containing materials, organo-silicate glass, porogen-containing materials, and combinations thereof. Low-k dielectric layer 28 may be deposited using a chemical vapor deposition (CVD) method, preferably plasma enhanced CVD (PECVD), although other commonly used deposition methods such as low pressure CVD (LPCVD), atomic layer chemical vapor deposition (ALCVD), and spin-on can also be used.

A first treatment, which preferably includes a curing process, is then performed. The curing process can be performed using commonly used curing methods, such as ultraviolet (UV) curing, eBeam curing, thermal curing, and the like, and may be performed in a production tool that is also used for PECVD, atomic layer deposition (ALD), LPCVD, etc. In an exemplary UV curing process, an ultraviolet radiator tool is used. The treatment serves the functions of driving porogen out of low-k dielectric layer 28 and improving its mechanical property. Pores will then be generated in low-k dielectric layer 28.

Figure 6:
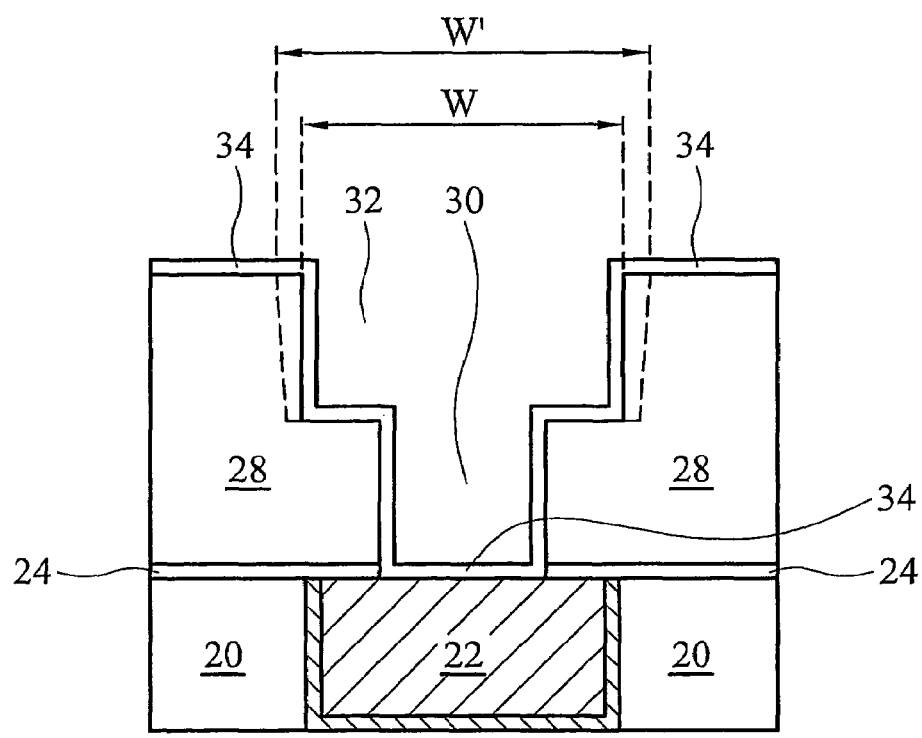

FIG. 6 illustrates the formation of a via opening 30 and a trench opening 32 in low-k dielectric layer 28. Photo resists (for example, photo resist 29 in FIG. 5) are formed and patterned over low-k dielectric layer 28 to aid in the formation of via opening 30 and trench opening 32. In the preferred embodiment, an anisotropic dry etching cuts through low-k dielectric layer 28 and stops at ESL 24, thereby forming via opening 30. Trench opening 32 is then formed. Since there is no etch stop layer for stopping the etching of trench opening 32, etching time is controlled so that the etching of trench opening 32 stops at a desired depth. In alternative embodiments, a trench-first approach is taken, in which trench opening 32 is formed prior to the formation of via opening 30. The etching gases preferably include $C_xF_y$ based gases such as $CF_4$, $CHF_3$, $CH_2F_2$, and $C_4F_8$ and diluting gases including $H_2$, CO, $CO_2$, $O_2$, $H_2O$, $N_2O$, $NH_3$, $CH_4$, $CO/CO_2$, $N_2/H_2$, $N_2/O_2$, and combinations thereof. Photo resist 29 is then removed, preferably by an ashing process. Next, ESL 24 is etched through via opening 30, exposing underlying conductive line 22.

In the preferred embodiment, low-k dielectric layer 28 contains silicon, oxygen and carbon. Carbon may be present in the compound in the form of methyl, ethyl, and the like. During the etching process, polymers, for example, $CF_x$ such as $CF_4$, are formed on the exposed surfaces of low-k dielectric layer 28 and the top surface of conductive line 22. The polymers are schematically illustrated as polymer layer 34. Polymer layer 34 not only increases the k value of the interconnect structure, but also reduces its reliability. Particularly, polymer layer 34 on the top surface of conductive line 22 increases the via resistance and also affects its reliability. Therefore, polymer layer 34 needs to be removed.

An in-situ plasma treatment is then performed to remove polymer layer 34. As the name suggests, the in-situ plasma treatment is performed in the same chamber as used for etching low-k dielectric layer 28. The process gases preferably include, but are not limited to, a combined gas of $N_2$ and $H_2$ (referred to as $N_2/H_2$ hereinafter), a combined gas of $N_2$ and $O_2$ (referred to as $N_2/O_2$ hereinafter), and combinations thereof. Alternatively, the process gases preferably include $H_2$, CO, $CO_2$, $O_2$, $H_2O$, $N_2O$, $NH_3$, $CH_4$, $CO/CO_2$, $N_2/H_2$, $N_2/O_2$, and combinations thereof. In addition, fluorine-based gases, such as $NF_3$, $CF_4$, and the like, can also be used as the process gases. The carrier gases preferably include inert gases, He, Ne, Ar, Kr, Xe and Rn, and combinations thereof. The process conditions preferably include a temperature of between about room temperature and about 450° C., a pressure of between about 0.5 mtorr and about 100 torr, an RF power of between about 50 W and about 5 KW, and a process time of between about 5 seconds and about 600 seconds.

After the in-situ plasma treatment, a wet clean process may be performed to further remove the polymers. Since the in-situ plasma treatment has removed at least most, if not all, of the polymers, the wet clean process may be performed for a shorter duration, and may use cleaning solutions with lower chemical concentrations. As a result, the critical dimension change is reduced.

FIG. 6 schematically illustrates a comparison of the positions of the openings 30 and 32 between the conventional polymer cleaning processes and the preferred polymer cleaning processes, wherein dotted lines represent a possible position of the trench opening 32 if a conventional wet-only cleaning process is used, and solid lines represent the position of the opening if an in-situ plasma treatment is performed. The results indicate that width W' of trench opening 32 caused by conventional processes will be greater than width W of the preferred embodiment of the present invention. After the wet cleaning process, the wafer is baked in a furnace.

Figure 7:
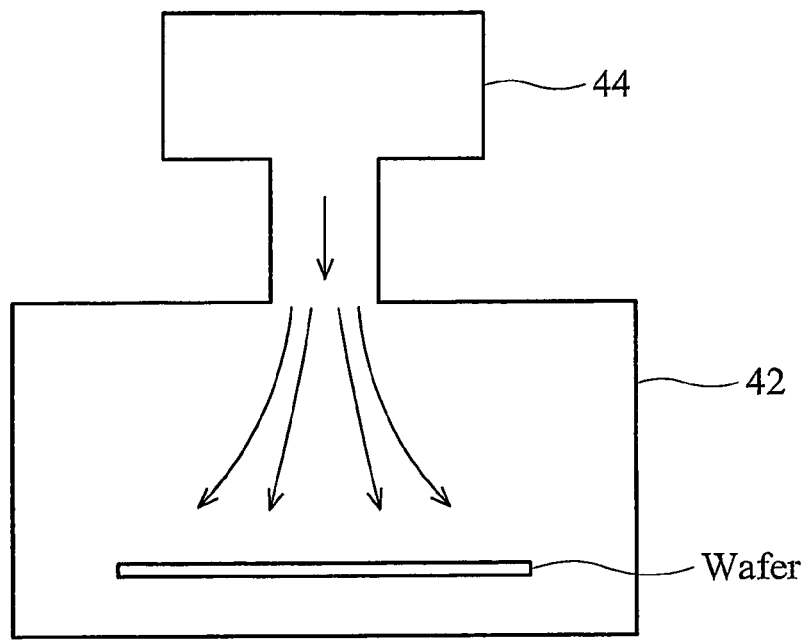
FIG. 7 schematically illustrates a remote plasma treatment system.

Due to the removal of ESL 24, metal line 22 is exposed, and undesired layers, such as copper oxide, may be generated on the surface of metal line 22. This undesirable layer needs to be cleaned before the formation of a diffusion barrier layer. Referring to FIG. 7, the wafer, on which the illustrated structures are formed, is moved to a separate chamber for a remote plasma treatment, which is preferably different from the chamber used for the in-situ plasma treatment. The remote plasma treatment environment includes a processing chamber 42, which is connected to a plasma generator 44. An example of the remote plasma treatment environment includes an integrated plasma source and power-delivery system (Model number Litmas® RPS 1501 and 3001) manufactured by Advanced Energy Industries, Inc.

The reaction gases and carrier gases are fed into plasma generator 44 to generate reaction-gas-containing plasma. The preferred process gases include, but are not limited to, $N_2/H_2$, $N_2/O_2$, and combinations thereof. Alternatively, the process gases include $H_2$, CO, $CO_2$, $O_2$, $H_2O$, $N_2O$, $NH_3$, $CH_4$, $CO/CO_2$, $N_2/H_2$, $N_2/O_2$, and combinations thereof. In addition, fluorine-based gases, such as $NF_3$, $CF_4$, and the like, can be used as the process gases. The carrier gases preferably include inert gases, He, Ne, Ar, Kr, Xe and Rn, and combinations thereof. The remote plasma generated reaction gases are then fed to the semiconductor wafer within chamber 42 for the remote plasma treatment. The process conditions preferably include a temperature of between about room temperature and about 450° C., a pressure of between about 0.5 mtorr and about 100 torr, an RF power of between about 50 W and about 5 KW, and a process time of between about 5 seconds and about 600 seconds.

With the reaction-gas-containing plasma remotely generated, charges (ions and electrons) are confined within the plasma generator 44 and only charge-neutral species flow from plasma generator 44 into process chamber 42 and interact with the wafer. The reduction of charges results in a reduction in the property shift of the low-k dielectric material.

Figure 8:
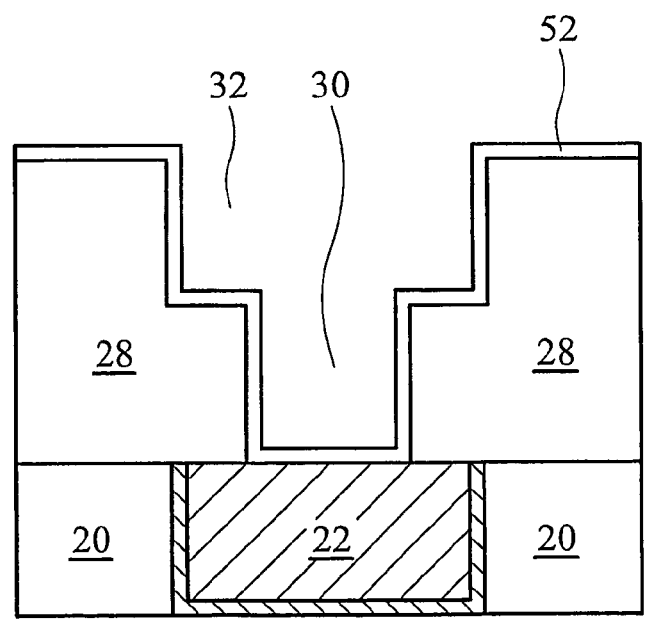
FIGS. 8 and 9 are cross-sectional views of intermediate stages in the manufacture of a preferred interconnect structure.
Figure 9:
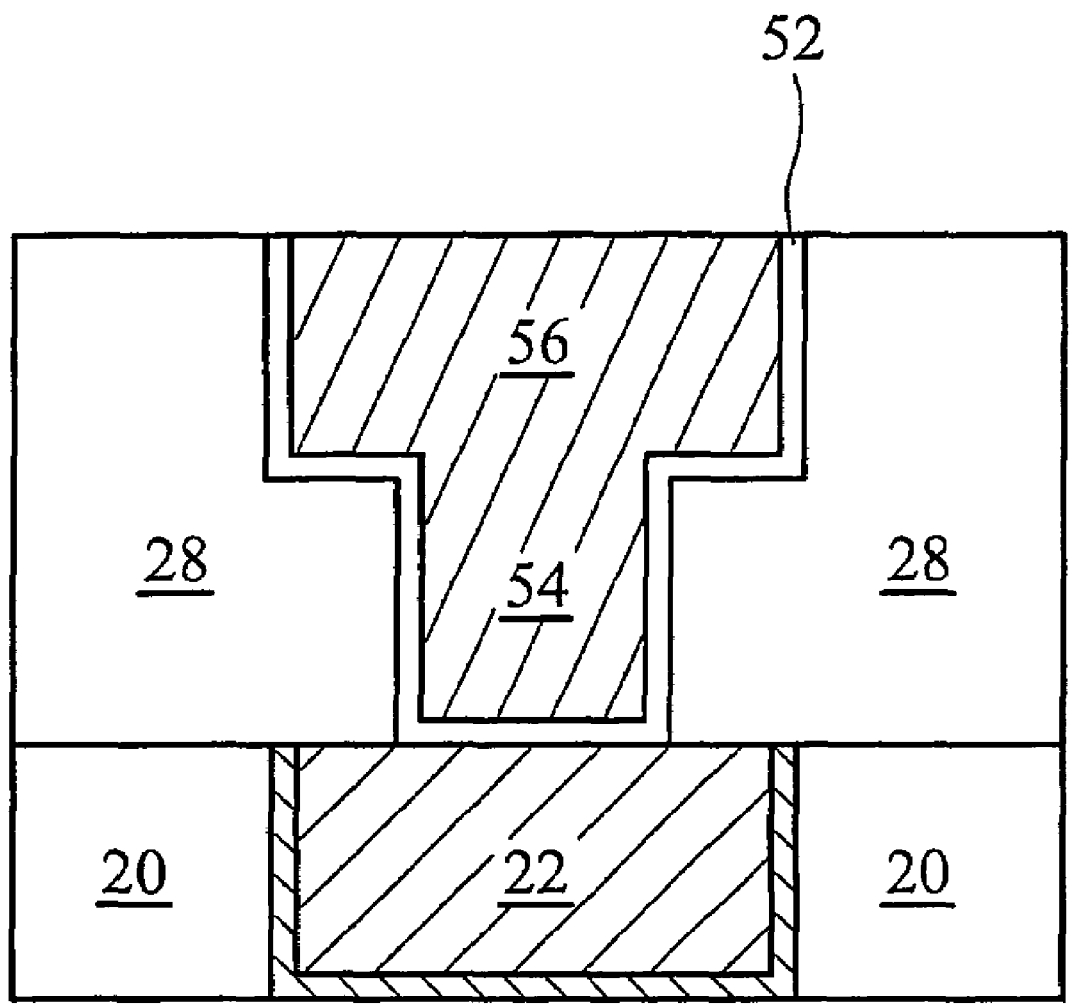

FIGS. 8 and 9 illustrate the formation of a barrier layer 52, a via 54 and a metal line 56. Referring to FIG. 8, diffusion barrier layer 52, which preferably includes titanium, titanium nitride, tantalum, tantalum nitride, silicon carbide, silicon oxycarbide, and the like, is formed. Barrier layer 52 prevents the via material, particularly copper, from diffusing into low-k dielectric layer 28 and causing circuit degradation. Referring to FIG. 9, a seed layer (not shown) is formed on diffusion barrier layer 52, followed by the filling of a conductive material into via opening 30 and trench opening 32. The conductive material is preferably a metallic material including copper, tungsten, metal alloys, metal silicide, metal nitrides, and the like. The formation of diffusion barrier layer 52 and the seed layer may be preferably performed in a same chamber as the remote plasma treatment, or in different chambers in a same system, which includes a plurality of chambers. The excess material is then removed by using a chemical mechanical polish (CMP) process, leaving metal line 56 and via 54.

Although the preferred embodiment uses dual damascene processes as examples, the teaching provided by the present invention is readily applicable to other cleaning processes in which undesirable polymers and/or metal oxide layers are to be removed.

Experiments have been performed to compare interconnect structures, which include vias between copper lines, formed using the enhanced cleaning process discussed in the preceding paragraphs to interconnect structures formed using conventional cleaning steps. The conventional cleaning steps include a wet-only polymer removal process and an in-situ plasma treatment prior to the formation of a diffusion barrier layer. It has been found that the preferred cleaning processes of the present invention cause substantially no damage (and substantially no change) to the low-k dielectric layer. This conclusion is supported by experiment results of Fourier Transform Infrared Spectroscopy (FTIR), which is an analytical technique used to identify organic (and in some cases inorganic) materials. This technique measures the absorption of various infrared light wavelengths by the material of interest. FTIR results have shown that the remote plasma treatment does not change the structure of low-k dielectric layer 28. Small-angle X-ray scattering (SAXS) has also proved that the pore size distributions before and after the remote plasma treatment are substantially the same. The same (FTIR and SAXS) analyses, however, indicate that a conventional in-situ plasma treatment changes the structure of the low-k dielectric layer. Further experiment results have shown the parasitic capacitance of the resulting interconnect structure is enhanced by the preferred embodiments. The electrical performance, including the line resistance, the inter-line leakage current, the via resistance, and the electrical migration, is comparable for interconnect structures formed using conventional processes and processes of the present invention.

The enlargement of the trench width caused by the cleaning processes is also reduced. The experiment results have revealed that the trench enlargement is about 7.5 nm from the time the trench opening is formed to the time the diffusion barrier layer is formed in conventional processes, while the trench enlargement is about 2.5 nm if the preferred embodiment of the present invention is used.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating an integrated circuit, the method comprising:
   providing a substrate;
   forming a low-k dielectric layer over the substrate;
   etching the low-k dielectric layer to form an opening in the low-k dielectric layer, wherein an underlying metal is exposed through the opening;
   performing an in-situ plasma treatment in a same chamber as the step of etching the low-k dielectric layer to remove polymers formed within the opening in the low-k dielectric layer, wherein the in-situ plasma treatment is performed after the etching;
   performing a remote plasma treatment to the low-k dielectric layer, wherein a plasma used for the remote plasma treatment is generated from a plasma generator separated from a chamber in which the substrate is located during the remote plasma treatment, the performing the remote plasma treatment being performed after the performing the in-situ plasma treatment;
   forming a diffusion barrier layer in the opening; and
   filling the opening with a conductive material.

2. The method of claim 1, wherein process gases used in the remote plasma treatment are selected from the group consisting essentially of a combined gas of $N_2$ and $H_2$, a combined gas of $N_2$ and $O_2$, and combinations thereof.

3. The method of claim 1, wherein process gases used in the remote plasma treatment are selected from the group consisting essentially of $H_2$, CO, $CO_2$, $O_2$, $H_2O$, $N_2O$, $NH_3$, $CH_4$, $CO/CO_2$, $N_2/H_2$, $N_2/O_2$, and combinations thereof.

4. The method of claim 1, wherein process gases used in the remote plasma treatment comprise fluorine-based gases.

5. The method of claim 1, wherein carrier gases used in the remote plasma treatment are selected from the group consisting essentially of He, Ne, Ar, Kr, Xe, Rn, and combinations thereof.

6. The method of claim 1, wherein the remote plasma treatment is performed at a temperature of between about room temperature and about 450° C.

7. The method of claim 1, wherein the remote plasma treatment is performed at a pressure of between about 0.5 mtorr and about 100 torr.

8. The method of claim 1, wherein the remote plasma treatment is performed at an RF power of between about 50 W and about 5 KW.

9. The method of claim 1, wherein the remote plasma treatment is performed for a process time of between about 5 seconds and about 600 seconds.

10. The method of claim 1, wherein the step of filling the opening with the conductive material comprises:
   forming the diffusion barrier layer in the opening after the remote plasma treatment;
   forming a seed layer on the diffusion barrier layer, wherein the steps of forming the diffusion barrier layer and the seed layer are performed in a same system as the remote plasma treatment; and
   filling the opening with the conductive material.

11. The method of claim 1, further comprising performing a wet clean after the performing the in-situ plasma treatment and before the performing the remote plasma treatment.

12. The method of claim 11, further comprising performing a furnace bake after the performing the wet clean and before the performing the remote plasma treatment.

* * * * *